(12) United States Patent
Pulugurtha et al.

(10) Patent No.: US 8,174,017 B2
(45) Date of Patent: May 8, 2012

(54) INTEGRATING THREE-DIMENSIONAL HIGH CAPACITANCE DENSITY STRUCTURES

(75) Inventors: Markondeya Raj Pulugurtha, Atlanta, GA (US); Devarajan Balaraman, Atlanta, GA (US); Isaac R. Abothu, Atlanta, GA (US); Rao Tummala, Stone Mountain, GA (US); Farrokh Ayazi, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 667 days.

(21) Appl. No.: 11/505,201

(22) Filed: Aug. 16, 2006

(65) Prior Publication Data

US 2007/0040204 A1 Feb. 22, 2007

Related U.S. Application Data

(60) Provisional application No. 60/709,135, filed on Aug. 17, 2005.

(51) Int. Cl.
*H01L 27/108* (2006.01)
(52) U.S. Cl. .......................................... 257/68; 257/40
(58) Field of Classification Search .................. 257/68, 257/40
See application file for complete search history.

(56) References Cited

U.S. PATENT DOCUMENTS

| | | | |
|---|---|---|---|
| 6,717,196 B2* | 4/2004 | Joo | 257/295 |
| 2002/0003249 A1* | 1/2002 | Park | 257/301 |
| 2002/0052112 A1* | 5/2002 | Lee et al. | 438/689 |
| 2002/0142546 A1* | 10/2002 | Kouznetsov et al. | 438/257 |
| 2004/0000686 A1* | 1/2004 | Houston | 257/306 |
| 2005/0191842 A1* | 9/2005 | Aggarwal et al. | 438/622 |
| 2005/0274227 A1* | 12/2005 | Aggarwal et al. | 75/710 |

* cited by examiner

*Primary Examiner* — Anthony Ho
(74) *Attorney, Agent, or Firm* — Trenton A. Ward, Esq.; Troutman Sanders LLP

(57) ABSTRACT

Disclosed are three-dimensional dielectric structures on high surface area electrodes and fabrication methods. Exemplary structures comprise a copper foil substrate, trench electrodes or high surface area porous electrode structures formed on the substrate, a insulating thin film formed on the surface and laminating the foil on a organic substrate. A variety of materials may be used to make the films including perovksite ceramics such as barium titanate, strontium titanate, barium strontium titanate (BST), lead zirconate titanate (PZT); other intermediate dielectric constant films such as zinc oxide, aluminum nitride, silicon nitride; typical paraelectrics such as tantalum oxide, alumina, and titania. The films may be fabricated using sol-gel, hydrothermal synthesis, anodization or vapor deposition techniques.

15 Claims, 9 Drawing Sheets

3D trenches on free standing foil from electroplating through a photoresist, dielectric coating to form a conformal insulated coating. Effective surface area is increased by a factor equal to the aspect ratio 3D trenches on silicon platform 300 Kholes/mm²
Micronic sizes 3D capacitors: 3D trenches on Si platform with oxidation and nitridation 3D capacitor structure Polymer micromaching Copper plating Remove photoresist High K coating 3D trenches on free standing foil from electroplating through a photoresist, dielectric coating to form a conformal insulated coating. Effective surface area is increased by a factor equal to the aspect ratio

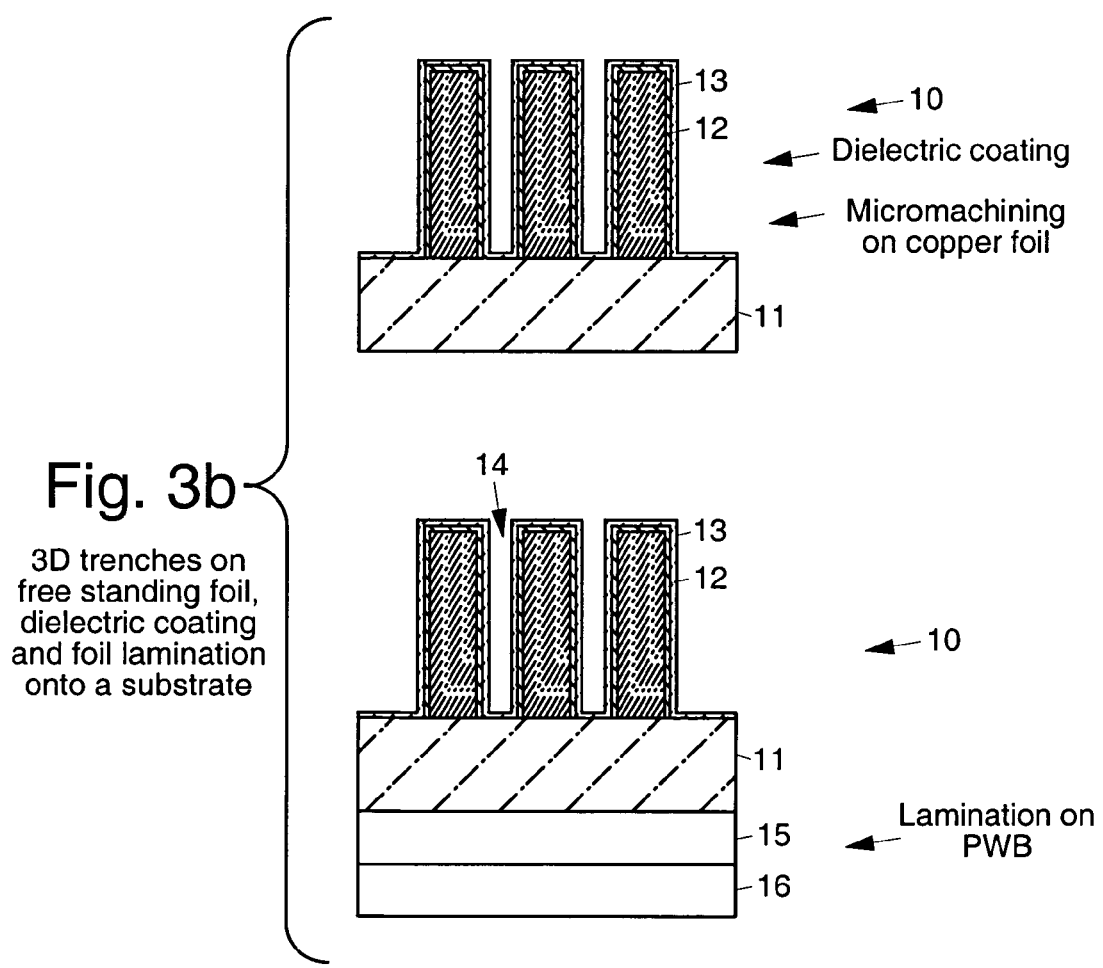

3D capacitors from sol-gel crystallization on micromachined silicon

Enlarged view 3D capacitors from fused metal particle electrodes on copper foil

INTEGRATING THREE-DIMENSIONAL HIGH CAPACITANCE DENSITY STRUCTURES

This application claims the benefit of U.S. Provisional Application No. 60/709,135, filed Aug. 17, 2005.

STATEMENT REGARDING FEDERALLY SPONSORED RESEARCH OR DEVELOPMENT

This invention was made in part with government support under Contract Number EEC-9402723 awarded by the National Science Foundation. Therefore, the government may have certain rights in this invention.

BACKGROUND

The present invention relates to embedded three-dimensional high capacitance density structures and methods for fabricating such structures.

Embedded ultra-high capacitance components are needed for applications such as noise suppression in high-speed circuits, high power electrode stimulators for implantable biomedical applications and miniaturized RF components. On-chip capacitance that take away valuable silicon real estate is needed to address high-frequency switching noise in today's digital circuits because package or board-level capacitors cannot be designed to provide low impedance power supply in the GHz frequency range. For mid-frequency decoupling, surface mount capacitors are required today because there is no available technology to embed high capacitance density films at package or board level. Similarly, for a typical biomedical neural stimulator application, approximately 10 µF is required to sustain operation of the stimulator without any reduction in voltage that could result in the failure of delivering the required stimulus current. For high electrode density implantable biomedical devices where miniaturization and low power are driving the components to be embedded on-chip or on-package, there is no available solution to provide the required capacitance density. New technologies, much beyond existing high-K (dielectric constant) thin film planar capacitors, are needed to address the emerging applications.

The choice of capacitor processing method is dependent on the constraints from integration (processing temperature) and cost (vacuum technology or solution deposition technologies), targeted capacitance density (capacitance per unit area), quality factor, operation frequency and breakdown voltage. The existing high K ceramic-polymer nanocomposite technology can only yield less than 5 nF/cm² because it is inherently not capable of thin film (<3 microns) processing and high dielectric constant. Incorporating metallic fillers can give ultrahigh dielectric constant at the expense of quality factor and several other uncertainties. Ultrahigh K films generally yield lower dielectric strengths (<100 V/microns). They cannot be thinned to sub-100 nm without compromising the Breakdown Voltage.

High capacitance density thin films may be achieved with physical or chemical vapor deposited ferroelectric or superparaelectric thin films. Simple planar (MIM) capacitors can only yield about 3-5 microafarad/cm². FIGS. 1a and 1b and Table 1 illustrate that using higher K films does not correspondingly scale-up the capacitance density because breakdown voltages demand thicker films. High dielectric strength oxides, nitrides and oxynitrides can be thinned to 30 nm or so but their dielectric constant is insufficient. Thin film capacitors show insufficient capacitance density for several biomedical applications unless they are integrated onto 3D/high aspect ratio platforms. Certain biomimetic implants demand a capacitance density above 50 µF/cm². To achieve ultrahigh capacitance densities, micromachined silicon and thermal oxidation/nitridation/oxynitridation of these silicon trenches are the most common options (FIGS. 2a and 2b) today. New innovations are needed to integrate higher capacitance densities in a low profile embedded capacitor format in organic or other substrates. Hence, there is an increasing demand for integrating 3D high dielectric constant structures on silicon or a compatible organic platform.

TABLE 1

| Thin film capacitor materials that can withstand 25 volts. | | |
|---|---|---|
| High K ferroelectrics Barium titanate Lead-based perovskites BST (few compositions) | Lower breakdown voltages require thicker films K reduces with film thickness | Capacitance limited to 30 nF/mm² |
| High K superparaelectrics Strontium titanate, BST | Dielectric constant low but stable with lower loss | Capacitance limited to 20 nF/mm² |
| Moderate K paraelectrics Tantalum oxide | Higher breakdown voltages allow thinner films | Capacitance limited to 5 nF/mm² |

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which:

FIG. 3b shows the concept of micromachined copper foil that is coated with a insulating film and transferred onto a organic substrate by lamination process;

DETAILED DESCRIPTION

Figure 1A:
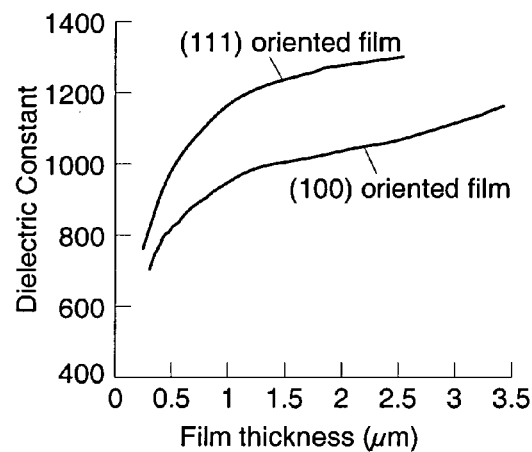
FIG. 1a is a graph that illustrates dielectric constant as a function of film thickness for typical thin film capacitor.
Figure 1B:
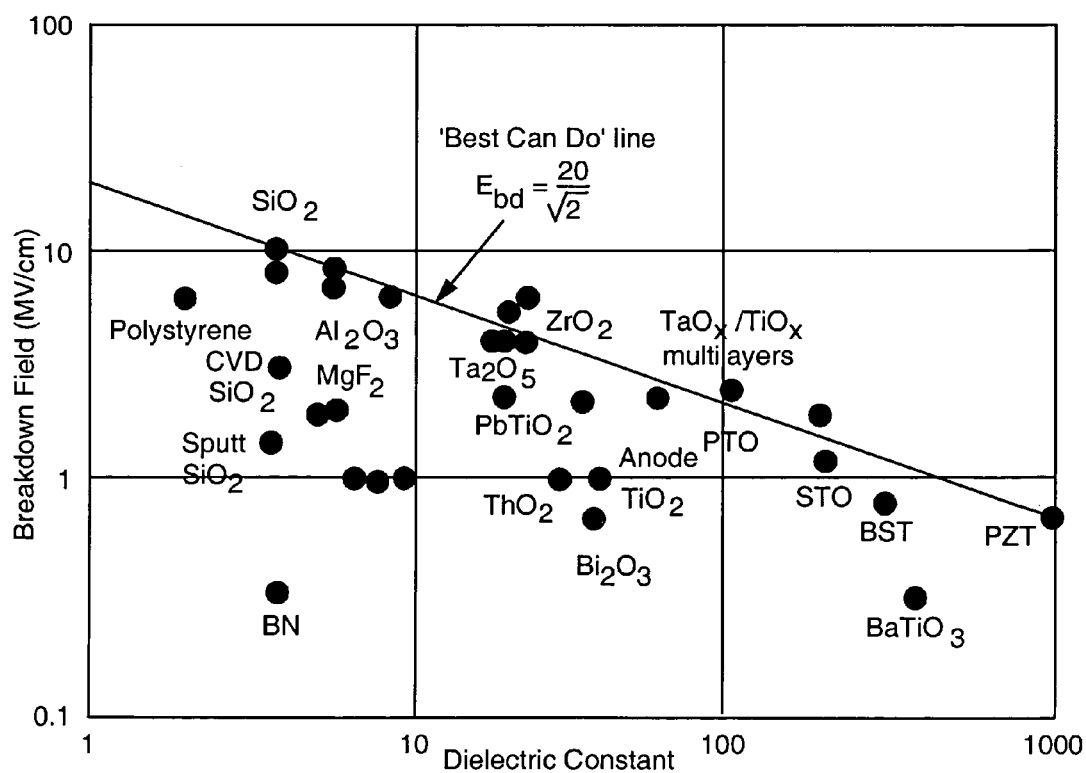
FIG. 1b is a graph that illustrates breakdown voltages of high K and low K materials.

A simple method to provide ultrahigh capacitance densities withstanding 20 V is to RF sputter a 200-300 nm barium strontium titanate (BST) film. The resulting dielectric constant (K) is higher than 600 with breakdown voltages exceeding 200 V/micron for a good quality film with minimal defects. Simple planar (MIM) capacitors may be used for baseline comparison. The resulting capacitance density is about 2-3 μF/cm². Given the temperature constraints from processing, the properties may even be inferior. Simple thin film approaches may yield capacitances of <1 microfarad in 5 mm×5 mm area. FIGS. 1a and 1b show that making higher K films does not correspondingly scale-up the capacitance density because the breakdown voltages demand thicker films.

Figure 2A:
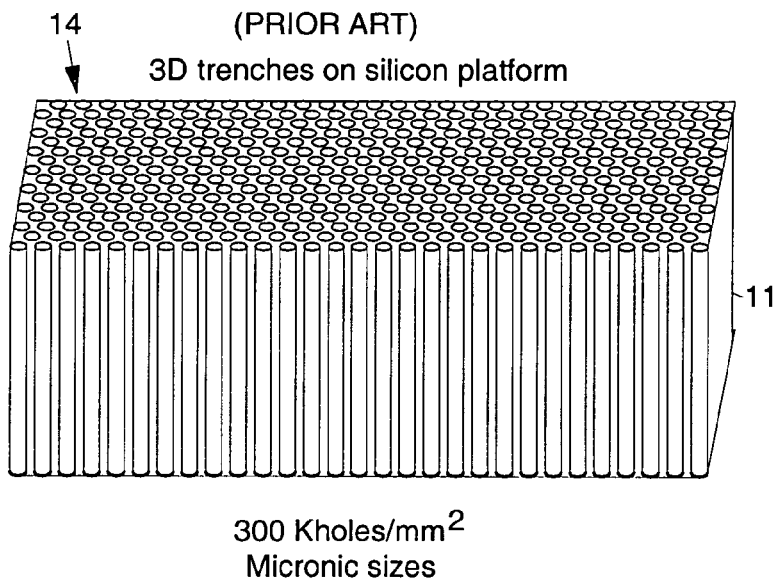
FIGS. 2a and 2b illustrate prior art capacitors using silicon trenches and thermal oxidation or nitridation.
Figure 2B:
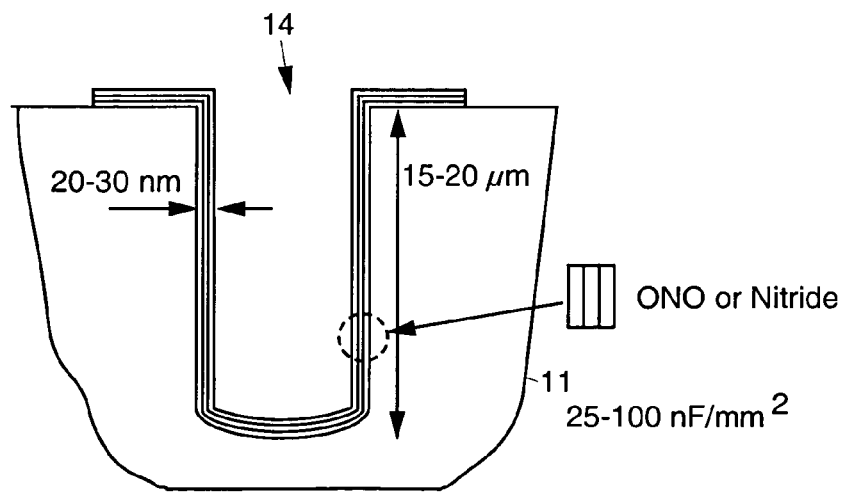

High capacitance densities may be achieved using sputtered ferroelectric/superparaelectric thin films. The resulting dielectric constant is higher than 600 with breakdown voltages exceeding 200 V/micron for a good quality film with minimal defects. High dielectric constant (K) materials generally show low breakdown strengths, as shown in FIG. 1b. The highest capacitance density is typically limited to 5 μF/cm². Other paraelectric thin film capacitors, which can be thinned down to less than 150 nm owing to their high breakdown voltage, can yield 0.5-1 μF/cm² for 25 volts breakdown. Simple planar (MIM) capacitors can only yield <1 μF in 5 mm×5 mm area. Higher planar dielectric constant films will not correspondingly scale-up the capacitance density for this application because the breakdown voltages demand thicker films. Contoured structures with deep sidewalls and trenches are required to integrate higher capacitance densities in low profile embedded capacitor format. FIGS. 2a and 2b illustrate prior art capacitors using silicon trenches and thermal oxidation or nitridation, and over which the presently disclosed capacitors are an improvement.

Disclosed are three-dimensional high capacitance density structures 10 (FIGS. 3a, 3b) including capacitors 10 having high dielectric constants, or battery structures 10 (batteries 10). Exemplary three-dimensional capacitors are fabricated using high dielectric constant (K) thin films. Deep three dimensional contours, combined with ceramic thin films yield capacitance values on the order of 1000 nF/mm², up to 20 times higher than what can be offered by existing thin film materials and processes. Three dimensional structures can yield higher capacitance densities because the sidewalls increase the effective electrode area without increasing the area on the substrate.

Electrochemical plating and etching concepts are suitable for improving the capacitance density on any platform. Trenches or walls with large aspect ratio 14 can yield higher capacitance densities because the sidewalls increase the effective electrode area without increasing the area on the wafer. Deep reactive ion etching may be used to etch deep 14 or cavities 14 in substrates 11 with relatively high aspect ratio (>1:20, with 5 micron deep trenches). Most systems utilize the so-called "Bosch process", in which a fluoropolymer is used to passivate the etching of the sidewalls. Typical aspect ratios of 20 and higher can be achieved leading to 20 times higher capacitance density. Anisotropic etching methods such as wet electrochemical etching or dry plasma etching are also used to form deep trenches 14 in the substrates 11. Deep anisotropic etching, when combined with nanotechnology (for example, self-assembled nanopatterns using diblock copolymers) can lead to extremely high capacitance densities with low profiles. Line-of-sight methods may not coat the entire sidewall with the high K film 12. The high K film 12 can be conformally deposited on the sidewalls using metallorganic solution deposition methods or solution reaction methods such as hydrothermal crystallization or anodization methods.

Figure 3A:
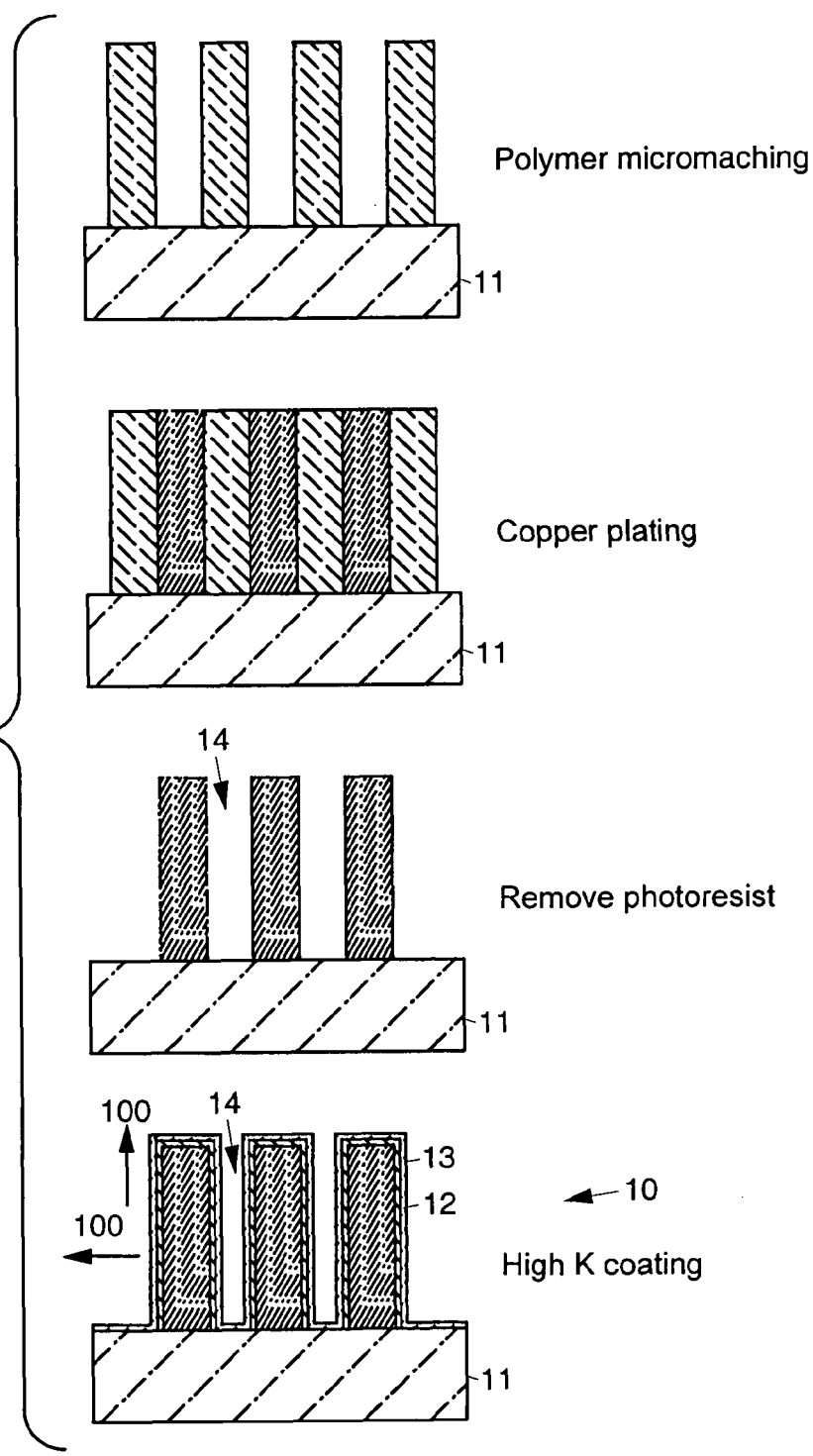
FIG. 3a illustrates the structure formation of an exemplary three-dimensional capacitor.
Figure 6A:
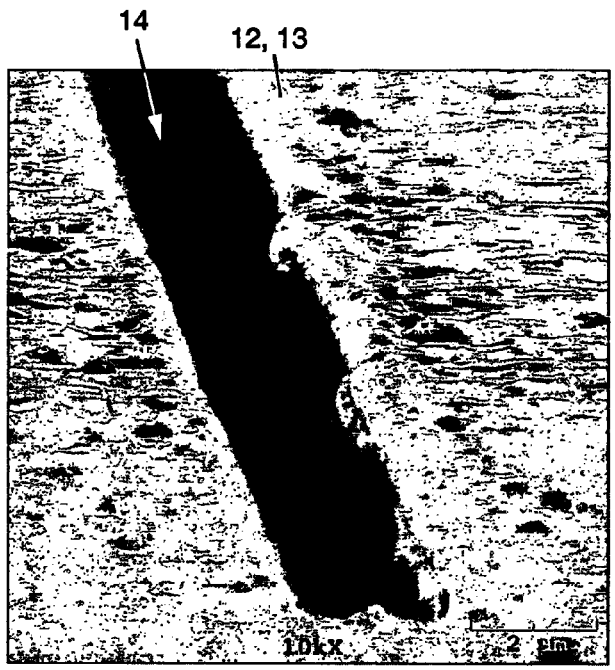
FIG. 6 shows sol-gel derived PZT on vertical sidewalls of a silicon trench as an exemplary reduced-to-practice three-dimensional high-aspect ratio capacitor structure having ultra-high capacitance densities.
Figure 6B:
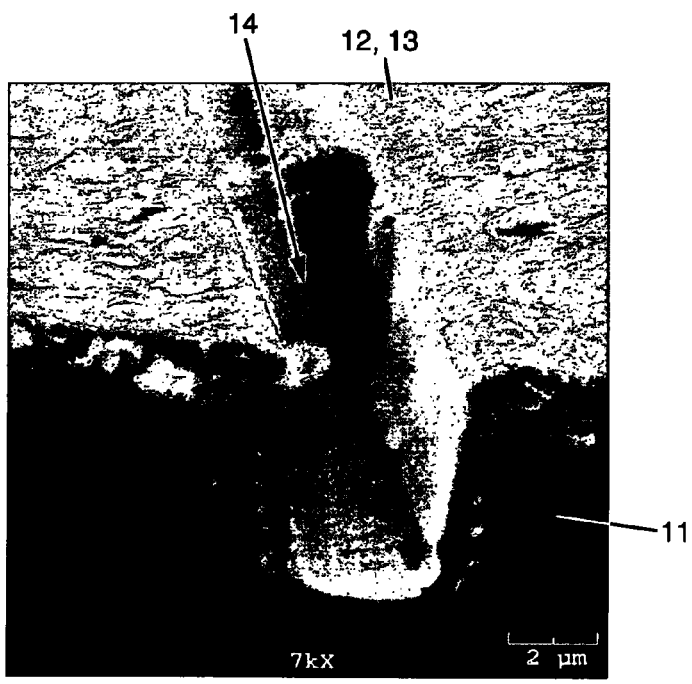

Novel low cost thin film capacitor technology with or without textured (single-crystal like) submicron thin films, when combined with high-surface area electrodes, overcome the above-discussed limitations, providing ultra-high capacitance density three-dimensional capacitors. FIGS. 3a and 3b illustrate the structure of an exemplary three-dimensional capacitor 10 or capacitor structure 10. FIGS. 6 and 7 are SEM views of exemplary reduced-to-practice three-dimensional high-aspect ratio capacitor structure 10 having ultra-high capacitance density.

The exemplary three-dimensional capacitor 10 or capacitor structure 10 shown in FIG. 3a comprises a substrate 11, such as a silicon substrate 11 or wafer 11, for example, having trenches 14 formed therein. Surfaces of the trenches 14 have a conformal coating 12 or thin film 12, such as barium titanate, strontium titanate, titania, tantalum oxide, PZT, zinc oxide or aluminum nitride, for example, formed thereon. Surfaces of the conformal coating 12 or thin film 12 have a layer of metal 13 comprising electrodes 13 formed thereon. Exemplary materials for forming the electrodes 13 include copper, nickel, titanium, tantalum, aluminum, for example.

Exemplary reduced-to-practice three-dimensional capacitors 10 have an effective surface area that is increased by the three dimensional surface contours. Solution derived methods may be employed for conformal coating the capacitors 10. Low temperature crystallization may be achieved using a hydrothermal or wet chemical oxidation (anodization) process. Sol-gel and rapid thermal annealing may be used to yield textured films 12.

Figure 5A:
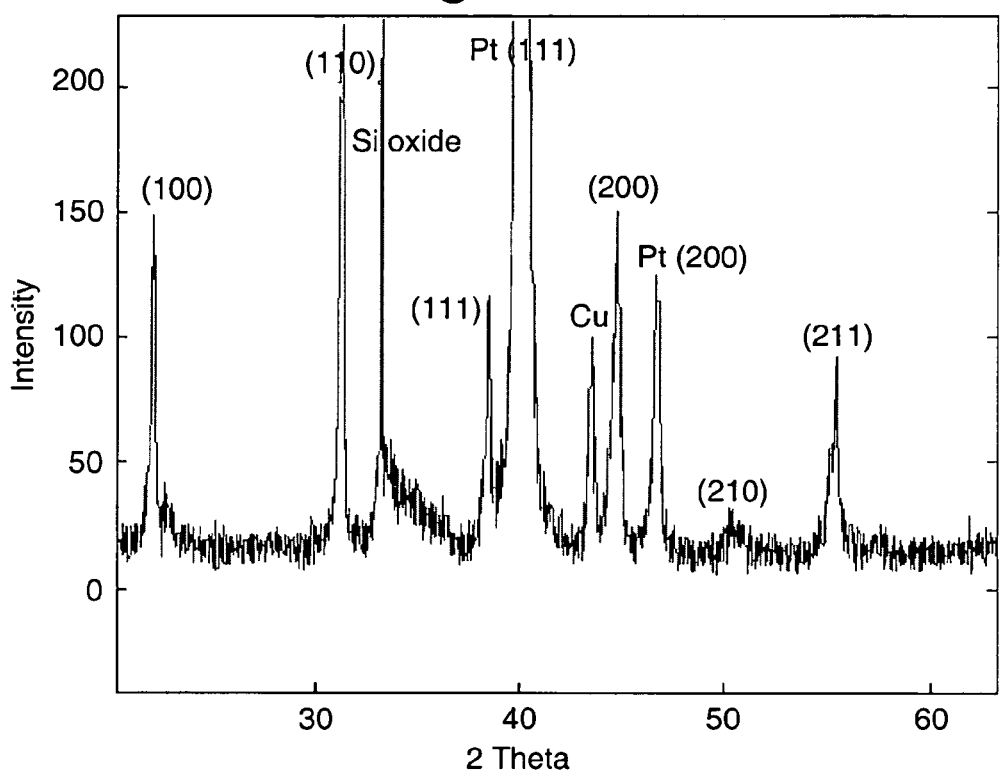
FIGS. 5a and 5b show an XRD (X-ray diffraction) pattern and cross-section of a PZT film on Pt/Ti/Si with three coatings of 0.4 molar PZT solution.
Figure 5B:
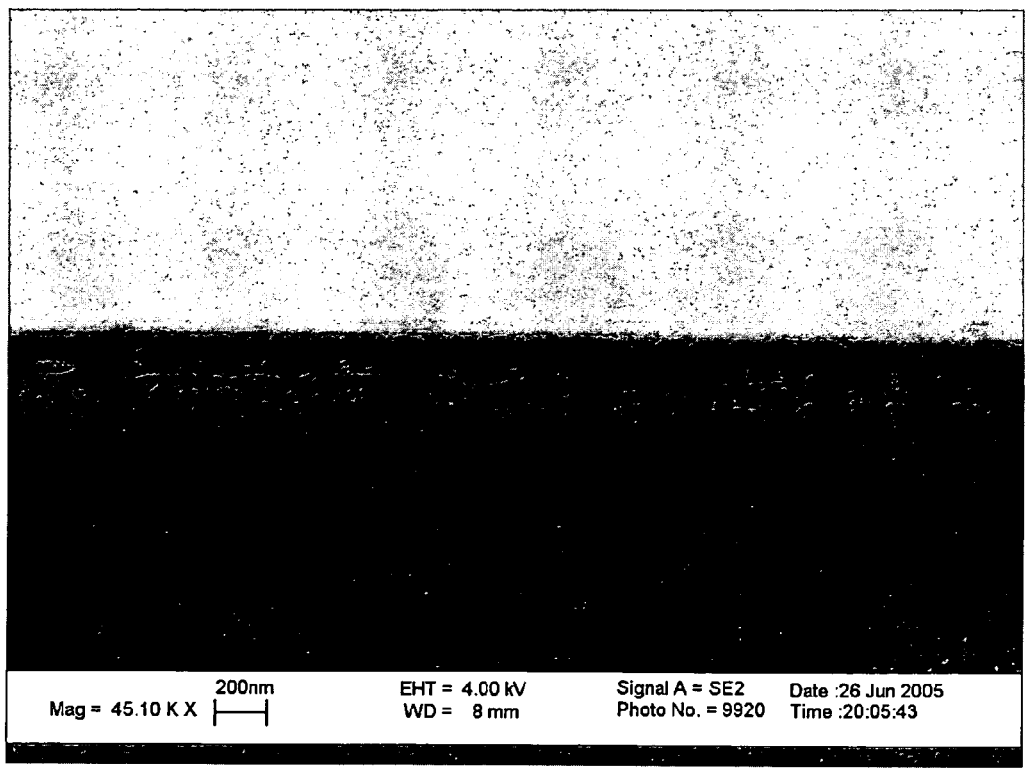

It has been demonstrated that certain perovskites can be grown with specific orientation on silicon substrates 11. By tuning the heat treatment (pyrolysis and rapid thermal processing to prevent extraneous low temperature pyrochlore phases), the kinetics of nucleation and growth can be altered to preferentially grow (100) textured titanates with dielectric constants above 1000 even when the film thickness approaches 100 nm. FIG. 5a is a graph that is illustrative of an exemplary reduced-to-practice textured PZT film 12 fabricated using a low-cost sol-gel process. FIG. 5b is illustrative of a highly (100) oriented PZT (80/20) film 12 deposited on (111) oriented Pt/Si (100)substrate 11. With textured ultrathin sol-gel films 12, thin film capacitors 10 (100 μm) were demonstrated having a capacitance density as high as 50 nF/mm² with textured PZT using rapid thermal annealing. The presently disclosed techniques further integrate such high K films 12 with high-surface area electrodes leading to a capacitance density improvement by a factor of 5-20 compared to any existing thin film technology.

Three-dimensional capacitors using sol-gel synthesis: Solution-derived methods lead to conformal coatings unlike physically deposited films 12. Nanodimensional trenches increase the surface area giving ultrahigh capacitances. The high K film 12 may be conformally deposited on the sidewalls using solution-derived coating processes or surface activated film growth methods such as hydrothermal process/CVD. RF sputtering may also be used with proper processing conditions. With an aspect ratio of 20:1 (10 micron wide and 200 micron tall), a capacitance density of 200 nF/mm² can be achieved. Further improvements in capacitance density may be achieved with multiple coatings at the expense of more processing steps.

The sol-gel process has the inherent ability to provide precise stoichiometry control, and conformal, continuous, large-area deposition via cost-effective spin or dip-coating. The composition can be chosen to tailor properties such as leakage current and temperature coefficient of capacitance (TCC). One source of leakage in barium titanate films 12 is the presence of crystal defects. For example, films 12 synthesized by sol-gel techniques have a large concentration of oxygen vacancies when sintered in low oxygen partial pressures. Small additions of $Mg^{2+}$ have been shown to substitute $Ti^{4+}$ thus compensating for the positive charge on oxygen vacancies without creating free electrons, resulting in lower leakage currents. The composition may be precisely tuned with suitable additives such as Manganese and Yttrium, for example, to lower the leakage current and improve the breakdown voltage.

Three-dimensional capacitors using hydrothermal synthesis: This process yields crystalline thin films 12 at low temperatures with low cost infrastructure. This process can be easily scaled to large-area manufacturing. In this process, Ti precursor films are treated with $Ba^{2+}$ and $Sr^{2+}$ ions in highly alkaline conditions to synthesize corresponding titanates (80-100 C) in crystalline form. As-synthesized films 12 exhibit high dielectric loss and poor yield owing to the entrapped hydroxyl groups. Oxygen vacancies, surface states, OH— defects and non-central symmetric $Ti^{3+}$ ions are structural defects which can be responsible for the change in $TiO_2$ octahedron configuration leading to poor electrical performance. The films 12 when subsequently treated to reduce entrapped hydroxyl groups improve the dielectric loss and yield.

Three-dimensional capacitors using vapor-deposited methods: Other than solution-derived methods, vapor-deposited thin film technology may also be used to conformally coat three-dimensional surfaces 14. Chemical vapor deposition (CVD) is a surface activated process and can be used to easily grow conformal high K thin films 12.

Another method for achieving ultrahigh capacitance is to use partially sintered conducting particles to form high surface area. Nanostructured electrodes lead to ultrahigh surface area capacitors in small volume with a single layer coating process. Sub-micron powders have more than 10 $m^2/cc$ of powder volume. If the powder is packed to 40% density in a 250 micron thick film 12 and partially sinter the film 12 to maintain the mechanical integrity and form a conducting network, the resulting increase in surface area is about 1000 times. The high surface area nanostructured metal electrodes can be coated with the high K ceramics using sol-gel, CVD or other techniques to yield ultrahigh capacitance. Simple film growth methods such as oxidation, anodization can also result in the high dielectric constant when suitable electrodes are used. The film growth can be controlled to pass the breakdown voltage requirements. The film processing temperature may be limited to less than 400° C. with aluminum electrodes.

Three-Dimensional Capacitors Using Anodization:

The electrochemical process for anodization of metal includes a direct current power supply, ionic chemical solution, a platinized cathode, and the substrate itself that acts as the anode. The ionic solution is a mixture of alkyl glycol, tartaric acid, ammonium hydroxide and water. The process is generally done at room temperature.

With regard to solution-based methods used to produce exemplary three-dimensional high capacitance density structures, sol-gel was selected because of its inherent ability to provide precise stoichiometry control, and conformal, continuous, large-area deposition via cost-effective spin or dip-coating. Rapid thermal processing (RTP) was used for heat treatment. The advantages of this method are improved properties because of the tendency to form more textured films 12, faster processing times, less metal oxidation, and minimized film substrate interfacial reactions.

Figure 4:
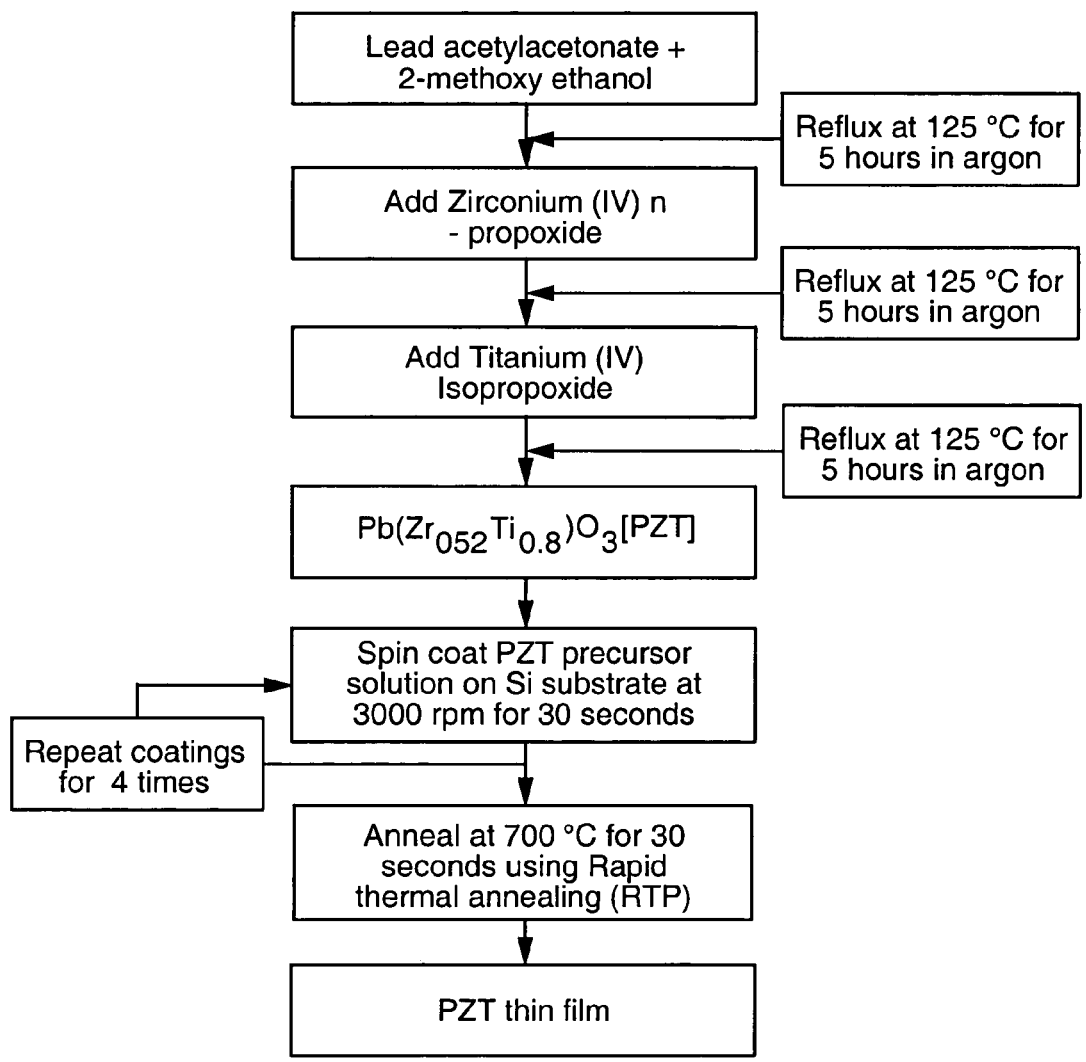
FIG. 4 is a flow chart illustrating an exemplary sol-gel method for preparing PZT coatings.

A flow chart illustrating an exemplary sol-gel method for preparing PZT thin films 12 is shown in FIG. 4. Lead acetylacetonate, zirconium (IV) n-propoxide (from AlfaAesar), titanium (IV) isopropoxide $Ti[OCH(CH_3)_2]_4$ (Aldrich), and 2-methoxyethanol (2-MOE) (Aldrich ) as solvent were the starting materials for the synthesis of $Pb(Zr_{0.52}Ti_{0.48})O_3$ [PZT] by sol-gel synthesis. Initially, the lead acetylacetonate was dissolved in 2-MOE in a flask and refluxed at 125 C for 5 hours in argon atmosphere. The precursor solution was cooled to room temperature and then the required amount of zirconium (IV) n-propoxide, along with 2-MOE as solvent, was added and refluxed at 125° C. for 5 hours in argon atmosphere to obtain a clear Pb—Zr complex solution. The Pb—Zr precursor solution was cooled to room temperature and then the required amount of titanium (IV) isopropoxide, along with 2-MOE as solvent, was added and refluxed at 125° C. for 5 hours in argon atmosphere to obtain a clear PZT precursor solution. A 0.4 molar concentration solution was used.

The PZT precursor solutions were spin-coated (P-6000, Integrated Technologies, Acushnet, Mass.) on silicon substrate 11. Spin coating was done at 3000 rpm for 30 seconds. Rapid pyrolysis of the PZT precursor films was achieved by placing them on a hot plate at 350° C. for about 3 minutes in air. By repeating this process for 3 times, thicker films were obtained. These amorphous films 12 were subsequently converted into crystalline PZT by heat treating at 700° C. for 30 seconds using RTP (AET addax, model RX) or furnace annealing.

Textured thin films: There is increasing evidence that certain perovskites can grown with specific orientation on silicon substrates 11. By tuning the heat treatment (pyrolysis and annealing temperature/time), [100] textured titanates may be grown with dielectric constants above 1000 even when the film thickness approaches 100 nm.

FIGS. 5a and 5b show an XRD (X-ray diffraction) pattern and cross-section of a PZT film 12 with three coatings of 0.4 molar PZT solution. The XRD shows partial orientation of $Pb(Zr_{0.52}Ti_{0.48})O_3$ film 12 deposited on [111] oriented Pt/Si (100) substrate 11. The peak intensity r for (100) and (110) is more than 0.6 while that for a randomly oriented PZT is around 0.1. The (100) peak is therefore relatively much stronger than a randomly oriented PZT indicating a significant degree of texture. The SEM shows 150-200 nm thin film 12 with no porosity even with 30 sec annealing at 700° C. The capacitance density of the film 12 was measured with sputtered electrodes on the top using an LCR meter (Agilent 4285A Precision LXR meter). The leakage current characteristics were measured with a Agilent Semiconductor Parameter Analyzer. Properties are summarized in Table 2.

TABLE 2

Summary of PZT coatings.

Sol-gel PZT coatings

| | |
|---|---|
| Annealing temperature (RTP) | ~700°/0.5 min |
| Thickness of the film | 150–200 nm |
| Capacitance density | 5 µF/cm$^2$ |
| Dielectric constant | ~1000 |
| Loss tangent | ~0.03 |
| Breakdown voltage | >15 V |
| Leakage current | 10 µA/cm$^2$ at 3 V |

3D sol-gel capacitors. Physical vapor deposition methods are mostly line-of-sight coating methods and may not uniformly coat the entire sidewall with the high K film 12. Trench capacitors in silicon are generally deposited with thermal oxidation or nitridation methods, resulting in films 12 with dielectric constant less than 7. High K films 12 may also be conformally deposited on the sidewalls using surface-activated film vapor deposition growth methods such as PECVD/MOCVD, but textured films 12 with dielectric constant above 1000 have not been reported with these thin film synthesis routes. With the sol-gel approach discussed above, films 12 with dielectric constant >600 can be utilized for the high capacitance of about 50 μF/cm². FIG. 6 shows sol-gel derived PZT on the vertical sidewalls of a silicon trench 14. Three coatings with 0.4 molar solution were deposited. The coating thickness was found be uniform with complete coverage of the sidewalls.

3D hydrothermal barium titanate capacitors. An alternative low-temperature solution-derived hydrothermal crystallization technique was demonstrated to yield conformal coating on vertical sidewalls of a trench 14. Using this technique, a Ti solution was conformally coated over the micromachined silicon. After baking at 150° C., the film 12 was treated with 2 molar $Ba(OH)_2$ solution at 95° C. to conformally coat crystalline $BaTiO_3$ films 12 on the silicon trenches 14. The processing temperature was less than 150° C. in this case in order to extend this technique onto organic substrates 11.

Figure 7A:
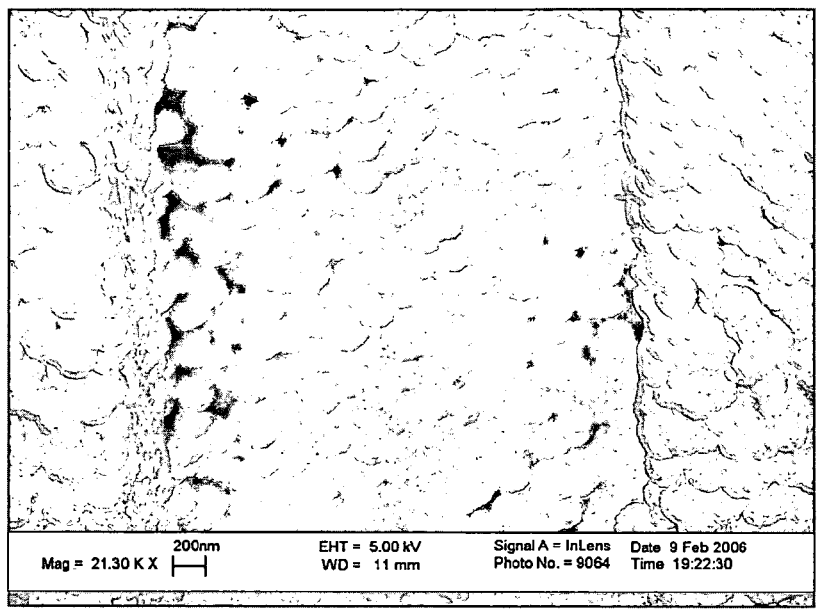
FIGS. 7a and 7b show SEM images illustrating top and cross-sectional views of conformally coated insulating film on a 3D surface by a chemical solution reaction.
Figure 7B:
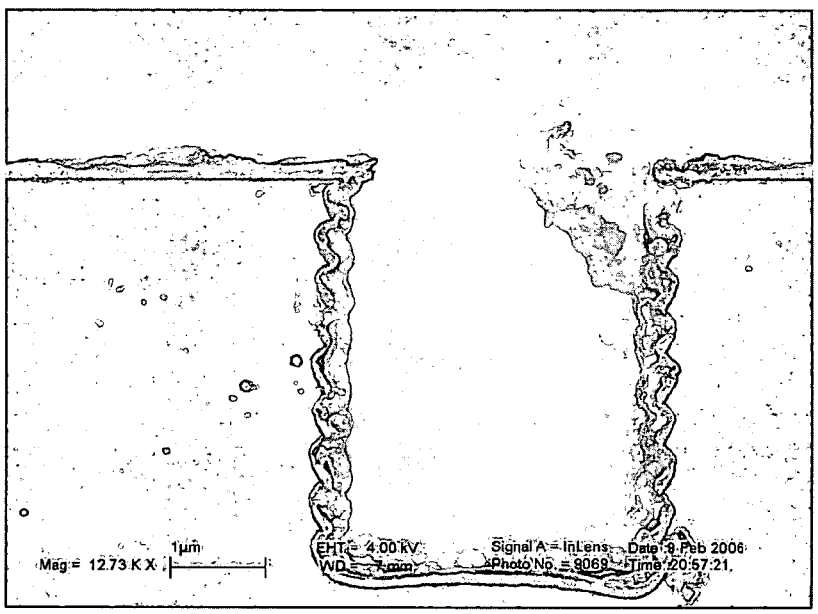

FIGS. 7a and 7b show SEM images illustrating top and cross-sectional views of hydrothermally coated barium titanate on micromachined silicon. Because of the isotropic nature of solution coating and solution treatment, the coating is found to be uniform across the sidewalls. This technique is not limited to silicon substrates 11 and may be extended to any organic substrates 11.

Thus, 3D integration of high dielectric constant and piezoelectric structures on a silicon platform has been demonstrated with solution-derived processes such as sol-gel and hydrothermal techniques. Conformal coating of high aspect-ratio trenches 14 was demonstrated by suitably modulating the process. With the sol-gel technique, heat treatment steps are critical to ensure crack and pore-free vertical structures. Conformal coating with hydrothermal techniques can be easily extendable to any platforms because of its low-temperature processing.

Figure 8:
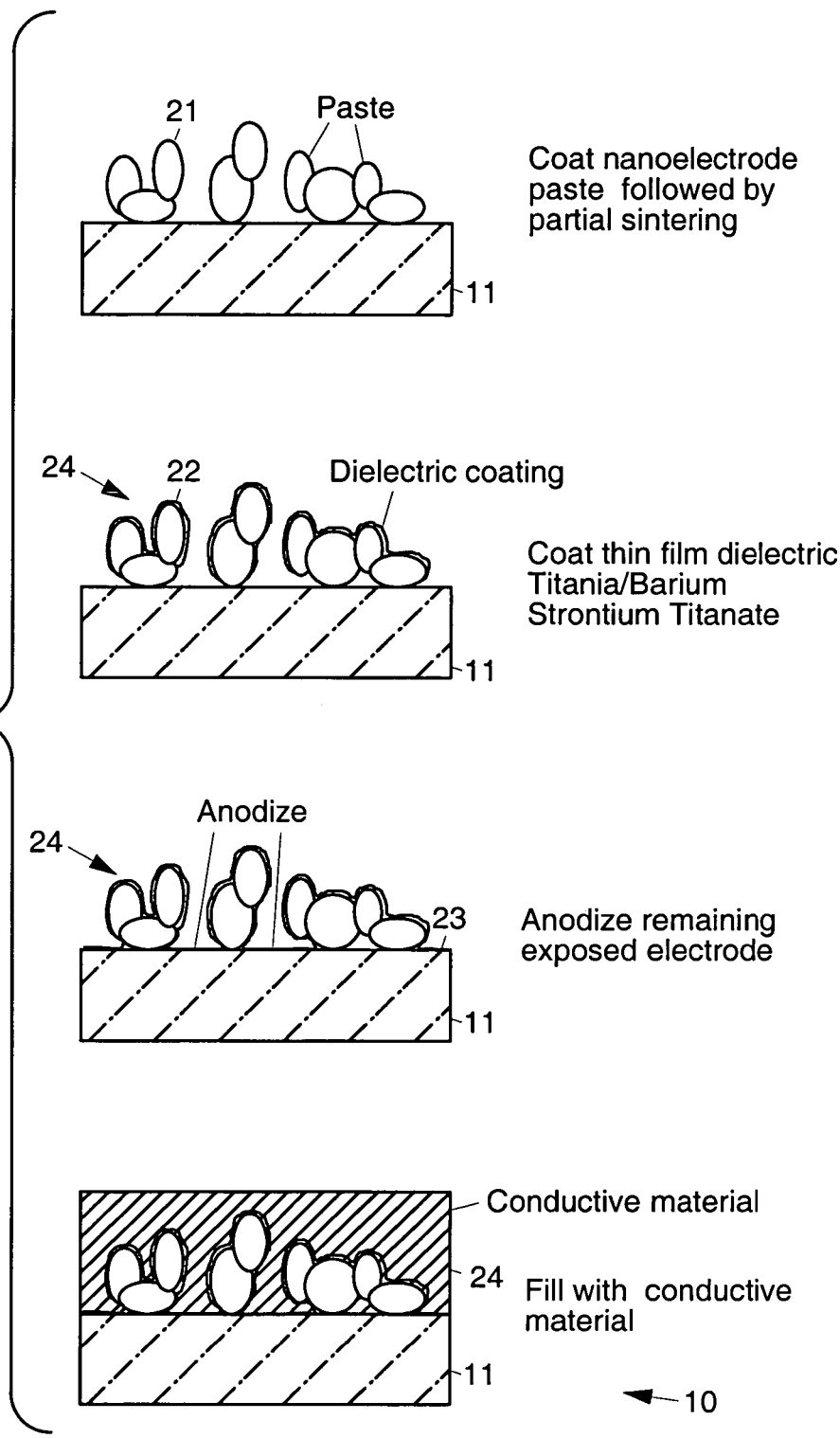
FIG. 8 illustrates an exemplary method of coating a high surface area metal electrode on a copper foil, coating an insulating layer, and lamination onto a organic substrate.

FIG. 8 illustrates an exemplary method of coating a high surface area metal electrode 24 on a copper foil 21, coating an insulating layer 22, and lamination onto a organic substrate 11. Embedded capacitors 10 with high surface area nonplanar electrodes may be formed by depositing a metal particulate paste 21 on a substrate 11 which is then pyrolyzed and partially fused by heat treating the metal paste layer 21 to form a open porosity three-dimensional electrode 24. This nonplanar electrode 24 is then insulated by means of a dielectric coating 22 using a variety of methods such as electrochemical oxidation, hydrothermal crystallization, or solution-gellation heat treatment. A surface of the substrate 11 is then anodized 23 if necessary. Finally, the open porosity three-dimensional electrode 24 is then conformal coated or filled in with conductive electrode material to form the finished electrode 24.

Thus, three-dimensional high capacitance density structures and fabrication methods have been disclosed. It is to be understood that the above-described embodiments are merely illustrative of some of the many specific embodiments that represent applications of the principles discussed above. Clearly, numerous and other arrangements can be readily devised by those skilled in the art without departing from the scope of the invention.

What is claimed is:

1. Apparatus comprising:
   a metal foil on an organic substrate;
   nonplanar three-dimensional conducting surfaces formed on the metal foil on the organic substrate;
   an insulating thin film conformally formed on the conducting surfaces by chemically reacting the surface while immersed in a solution; and
   a second conducting layer conformally coated on top of the insulating thin film to form a capacitor or battery that is integrated as a part of the organic substrate.

2. The apparatus recited in claim 1 wherein the nonplanar surfaces are formed by electroplating conducting structures on the metal foil through a patterned polymer and subsequently removing the polymer.

3. The apparatus recited in claim 1 wherein the three-dimensional conducting surfaces are formed by wet or plasma etching the metal foil.

4. The apparatus recited in claim 1 wherein the three dimensional conducting surfaces are formed on a metal foil comprising titanium, niobium, tantalum, zinc, copper, or aluminum.

5. The apparatus recited in claim 1 wherein the nonplanar conducting surfaces are insulated by reacting with a heated metal ion solution to form the corresponding compound insulating film.

6. The apparatus recited in claim 1 wherein the insulating thin film is formed by a electrochemical oxidation process by anodizing the metal foil in a solution bath.

7. The apparatus recited in claim 1 wherein the insulating thin film is formed by a electrochemical oxidation process by anodizing the metal foil in a electrochemical solution bath.

8. Apparatus comprising:
   a metal foil on an organic substrate;
   a three-dimensional conducting surface on the metal foil on the organic substrate with organic layers, the three-dimensional conducting surface comprising a partially fused metal particle layer formed by heat treating a layer of metal paste;
   an insulating thin film formed on the conducting surface; and
   a conducting layer conformally coated on top of the insulating thin film to form a capacitor or battery that is integrated as a part of the organic substrate.

9. The apparatus recited in claim 8 wherein the substrate comprises thin copper, nickel or similar metal foil that is laminated onto another substrate.

10. The apparatus recited in claim 8 wherein the conducting surfaces are formed on a metal foil comprising titanium, niobium, tantalum, zinc, copper, aluminum, nickel, or chromium.

11. The apparatus recited in claim 8 wherein the insulated coating is formed by depositing a metallorganic solution coating that is then heat treated in a controlled oxygen, nitrogen or hydrogen environment.

12. The apparatus recited in claim 8 wherein the three-dimensional electrode is insulated by reacting with an metal ion solution to form the corresponding compounds.

13. The apparatus recited in claim 8 where the insulating thin film is formed on the conducting surface by heat treating the three-dimensional surface in air or nitrogen to form thin dielectric coating layers comprising metal oxides or nitrides.

14. The apparatus recited in claim 8 where the insulating thin film is formed on the conducting surface by chemical or physical vapor deposition thin insulating layers.

15. The apparatus recited in claim 8 where the insulating thin film is formed on the conducting surface by coating a polymer solution layer that is then cured to form the polymer thin film insulating layer.

* * * * *